(12) United States Patent
Komiyama

(10) Patent No.: US 10,330,743 B2
(45) Date of Patent: Jun. 25, 2019

(54) NONCONTACT POWER TRANSMISSION SYSTEM TO DETECT PRESENCE OF A METALLIC FOREIGN MATTER

(71) Applicant: SONY CORPORATION, Tokyo (JP)

(72) Inventor: Shinji Komiyama, Saitama (JP)

(73) Assignee: SONY CORPORATION, Tokyo (JP)

( * ) Notice: Subject to any disclaimer, the term of this patent is extended or adjusted under 35 U.S.C. 154(b) by 792 days.

(21) Appl. No.: 13/714,889

(22) Filed: Dec. 14, 2012

(65) Prior Publication Data

US 2013/0176023 A1 Jul. 11, 2013

(30) Foreign Application Priority Data

Dec. 26, 2011 (JP) ................................. 2011-283929

(51) Int. Cl.
| | |
|---|---|
| *G01R 33/028* | (2006.01) |
| *H02J 7/02* | (2016.01) |
| *H02J 50/60* | (2016.01) |
| *H02J 50/12* | (2016.01) |
| *G01V 3/12* | (2006.01) |
| *G01R 27/26* | (2006.01) |
| *H02J 5/00* | (2016.01) |

(52) U.S. Cl.
CPC ..... *G01R 33/0283* (2013.01); *G01R 27/2688* (2013.01); *G01R 33/028* (2013.01); *G01V 3/12* (2013.01); *H02J 5/005* (2013.01); *H02J 7/025* (2013.01); *H02J 50/12* (2016.02); *H02J 50/60* (2016.02)

(58) Field of Classification Search
CPC ... G01R 33/028; G01R 27/2688; H02J 5/005; G01V 3/12

USPC ................ 324/258, 649, 653; 307/104, 149; 320/108
See application file for complete search history.

(56) References Cited

U.S. PATENT DOCUMENTS

| | | | | |
|---|---|---|---|---|
| 8,064,825 | B2 * | 11/2011 | Onishi et al. ................ | 455/41.1 |
| 8,072,310 | B1 * | 12/2011 | Everhart ...................... | 340/10.1 |
| 8,198,754 | B2 * | 6/2012 | Iisaka et al. .................. | 307/104 |
| 2010/0045114 | A1 * | 2/2010 | Sample ................... | H02J 5/005 |
| | | | | 307/104 |

(Continued)

FOREIGN PATENT DOCUMENTS

| | | | |
|---|---|---|---|
| JP | 2000134830 A | * | 5/2000 |
| JP | 2001-275280 | | 10/2001 |

(Continued)

OTHER PUBLICATIONS

Kuyvenhoven, Neil, et al. "Development of a foreign object detection and analysis method for wireless power systems." Product Compliance Engineering (PSES), 2011 IEEE Symposium on. IEEE, 2011, newly cited, heretofore referred to as Kuyvenhoven.*

(Continued)

*Primary Examiner* — Huy Q Phan
*Assistant Examiner* — Adam S Clarke
(74) *Attorney, Agent, or Firm* — Chip Law Group

(57) ABSTRACT

A detecting device includes a reading coil configured to read a magnetic flux generated by a detecting coil for detecting a magnetic field of an electromagnetic wave output from an exciting coil according to the magnetic field. The detecting device further includes a Q-value measuring section configured to measure a Q-value of the detecting coil on a basis of a temporal transition of oscillation of a voltage obtained in the reading coil according to the magnetic flux generated by the detecting coil.

14 Claims, 8 Drawing Sheets

(56) References Cited

U.S. PATENT DOCUMENTS

| | | | | |
|---|---|---|---|---|
| 2010/0225271 | A1* | 9/2010 | Oyobe | B60L 5/005 320/108 |
| 2010/0277120 | A1* | 11/2010 | Cook | H01Q 19/005 320/108 |
| 2011/0018495 | A1* | 1/2011 | Komiyama | 320/108 |
| 2011/0081857 | A1* | 4/2011 | Lee | G06K 7/0008 455/41.1 |
| 2011/0082612 | A1* | 4/2011 | Ichikawa | B60L 11/182 701/22 |
| 2012/0001493 | A1* | 1/2012 | Kudo et al. | 307/104 |
| 2012/0049791 | A1* | 3/2012 | Tanabe | H01Q 7/00 320/108 |
| 2012/0119914 | A1* | 5/2012 | Uchida | H02J 5/005 340/584 |
| 2012/0175967 | A1* | 7/2012 | Dibben et al. | 307/104 |
| 2012/0217819 | A1* | 8/2012 | Yamakawa | B60L 11/182 307/104 |
| 2013/0063085 | A1* | 3/2013 | Takada | B60L 11/182 320/108 |
| 2013/0076153 | A1* | 3/2013 | Murayama | H02J 50/12 307/104 |
| 2013/0093535 | A1* | 4/2013 | Iio | H01P 5/19 333/126 |
| 2013/0094598 | A1* | 4/2013 | Bastami | H02J 5/005 375/259 |
| 2015/0035376 | A1* | 2/2015 | Baarman | H02J 5/005 307/104 |

FOREIGN PATENT DOCUMENTS

| | | |
|---|---|---|
| JP | 2008-206321 | 9/2008 |
| JP | 2010164472 A * | 7/2010 |

OTHER PUBLICATIONS

JP2001-206231, Published Sep. 4, 2008, English translation, 43 pages.
JP2001-275280, Published Oct. 5, 2001, English translation, 31 pages.

* cited by examiner

NONCONTACT POWER TRANSMISSION SYSTEM TO DETECT PRESENCE OF A METALLIC FOREIGN MATTER

BACKGROUND

The present disclosure relates to a detecting device, a detecting system, a power transmitting device, a noncontact power transmission system, and a detecting method for detecting the presence of a conductor such as a metal or the like.

Noncontact power transmission systems in which power is supplied on a noncontact basis (wireless feeding) have recently been actively developed. Systems for realizing wireless feeding are broadly classified into two kinds of methods.

One is an electromagnetic induction system already known widely. In the electromagnetic induction system, a degree of coupling between a power transmitting side and a power receiving side is very high, and thus feeding can be performed with high efficiency. However, a coupling coefficient between the power transmitting side and the power receiving side needs to be kept high. Thus, when a distance between the power transmitting side and the power receiving side is increased or there is a positional displacement between the power transmitting side and the power receiving side, efficiency of power transmission between coils on the power transmitting side and the power receiving side (which efficiency will hereinafter be referred to as efficiency between the coils) is greatly degraded.

The other is a method referred to as a magnetic field resonance system. The magnetic field resonance system has a feature of using a resonance phenomenon actively and thereby requiring only a small magnetic flux shared between a feeding source and a feeding destination. The magnetic field resonance system does not degrade the efficiency between the coils even in a case of a small coupling coefficient when a Q-value (Quality factor) is high. The Q-value is an index indicating relation between the retention and a loss of energy of a circuit having the coil on the power transmitting side or the power receiving side (indicating the strength of resonance of a resonant circuit). That is, the magnetic field resonance system has advantages of eliminating a need for alignment between the coil on the power transmitting side and the coil on the power receiving side and providing a high degree of freedom of positions of and a distance between the power transmitting side and the power receiving side.

One of important elements in a noncontact power transmission system is a measure against heat generated by a metallic foreign matter. Irrespective of whether the noncontact power transmission system is of an electromagnetic induction type or a magnetic field resonance type, when feeding is performed on a noncontact basis, and there is a metal between a power transmitting side and a power receiving side, an eddy current may occur in the metal and cause the metal to generate heat. A large number of methods for detecting a metallic foreign matter have been proposed as measures against the generation of the heat. For example, methods using an optical sensor or a temperature sensor are known. However, a detecting method using a sensor entails high cost in a case of a wide feeding range as in the magnetic field resonance system. In a case of a temperature sensor, for example, an output result of the temperature sensor depends on the thermal conductivity of the surroundings of the temperature sensor, so that design limitations are imposed on apparatuses on the power transmitting side and the power receiving side.

Accordingly, a method has been proposed which observes a change in parameter (current, voltage, or the like) when a metallic foreign matter is inserted between the power transmitting side and the power receiving side, and determines whether a metallic foreign matter is present or not. Such a method does not need to impose design limitations or the like, and reduces cost. For example, Japanese Patent Laid-Open No. 2008-206231 (hereinafter referred to as Patent Document 1) proposes a method for detecting a metallic foreign matter on the basis of a degree of modulation (information on changes in amplitude and phase) in communication between the power transmitting side and the power receiving side, and Japanese Patent Laid-Open No. 2001-275280 (hereinafter refereed to as Patent Document 2) proposes a method for detecting a metallic foreign matter on the basis of an eddy current loss (foreign matter detection based on DC-DC efficiency).

SUMMARY

However, the methods proposed by Patent Documents 1 and 2 do not consider effects of a metallic casing on the power receiving side. When the charging of an ordinary portable apparatus is considered, some metal (a metallic casing, a metallic part, or the like) is highly likely to be used in the portable apparatus, and it is thus difficult to distinguish whether a change in parameter is "caused by an effect of the metallic casing or the like" or "caused by the mixing in of a metallic foreign matter." Taking Patent Document 2 as an example, it is not possible to determine whether an eddy current loss is caused in the metallic casing of the portable apparatus or caused by the mixing in of a metallic foreign matter between the power transmitting side and the power receiving side. Thus, it may not be able to be said that the methods proposed by Patent Documents 1 and 2 can detect a metallic foreign matter with high accuracy.

The present disclosure has been made in consideration of the above situation. It is desirable to improve the accuracy of detection of a metallic foreign matter present in the vicinity of the power receiving side or between the power transmitting side and the power receiving side with a simple constitution.

According to a first mode of the present disclosure, there is provided a detecting device. The detecting device includes a reading coil configured to read a magnetic flux generated by a detecting coil for detecting a magnetic field of an electromagnetic wave output from an exciting coil according to the magnetic field. The detecting device further includes a Q-value measuring section configured to measure a Q-value of the detecting coil on a basis of a temporal transition of oscillation of a voltage obtained in the reading coil according to the magnetic flux generated by the detecting coil.

According to a second mode of the present disclosure, there is provided a detecting system. The detecting system includes a detecting coil configured to detect a magnetic field of an electromagnetic wave output from an exciting coil, and a reading coil configured to read a magnetic flux generated by the detecting coil according to the magnetic field. The detecting system further includes a Q-value measuring section configured to measure a Q-value of the detecting coil on a basis of a temporal transition of oscillation of a voltage obtained in the reading coil according to the magnetic flux generated by the detecting coil.

According to a third mode of the present disclosure, there is provided a power transmitting device. The power transmitting device includes a power transmitting coil configured to output a power transmission signal used for noncontact power transmission to an outside by radio. The power transmitting device further includes a power transmitting section configured to supply the power transmission signal to the power transmitting coil. The power transmitting device further includes a reading coil configured to read a magnetic flux generated by a detecting coil for detecting a magnetic field of an electromagnetic wave output from the power transmitting coil according to the magnetic field. The power transmitting device further includes a Q-value measuring section configured to measure a Q-value of the detecting coil on a basis of a temporal transition of oscillation of a voltage obtained in the reading coil according to the magnetic flux generated by the detecting coil.

According to a fourth mode of the present disclosure, there is provided a noncontact power transmission system includes a power transmitting device, and a power receiving device configured to receive power transmitted from the power transmitting device by radio. The power transmitting device includes a power transmitting coil configured to output a power transmission signal used for noncontact power transmission to an outside by radio. The power transmitting device further includes a power transmitting section configured to supply the power transmission signal to the power transmitting coil. The power transmitting device further includes a reading coil configured to read a magnetic flux generated by a detecting coil for detecting a magnetic field of an electromagnetic wave output from the power transmitting coil according to the magnetic field. The power transmitting device further includes a Q-value measuring section configured to measure a Q-value of the detecting coil on a basis of a temporal transition of oscillation of a voltage obtained in the reading coil according to the magnetic flux generated by the detecting coil. The power receiving device include a power receiving coil used to receive the power transmission signal output from the power transmitting device, and the detecting coil configured to receive the magnetic field of the electromagnetic wave output from the power transmitting device, and generate the magnetic flux according to the magnetic field.

According to a fifth mode of the present disclosure, there is provided a detecting method. The detecting method includes outputting an electromagnetic wave from an exciting coil. The detecting method further includes reading a magnetic flux generated by a detecting coil for detecting a magnetic field of the electromagnetic wave output from the exciting coil according to the magnetic field by a reading coil. The detecting method further includes measuring a Q-value of the detecting coil on a basis of a temporal transition of oscillation of a voltage obtained in the reading coil according to the magnetic flux generated by the detecting coil by a Q-value measuring section. Thus, according to the above modes of the present disclosure, a Q-value measuring circuit does not need to be provided on a side having the detecting coil (for example a portable terminal device).

According to the modes of the present disclosure, the accuracy of detection of a metallic foreign matter present in the vicinity of the detecting side or between an exciting side (for example a power transmitting side) and the detecting side (for example a power receiving side) can be improved with a simple constitution.

DETAILED DESCRIPTION OF THE PREFERRED EMBODIMENTS

Figure 1:
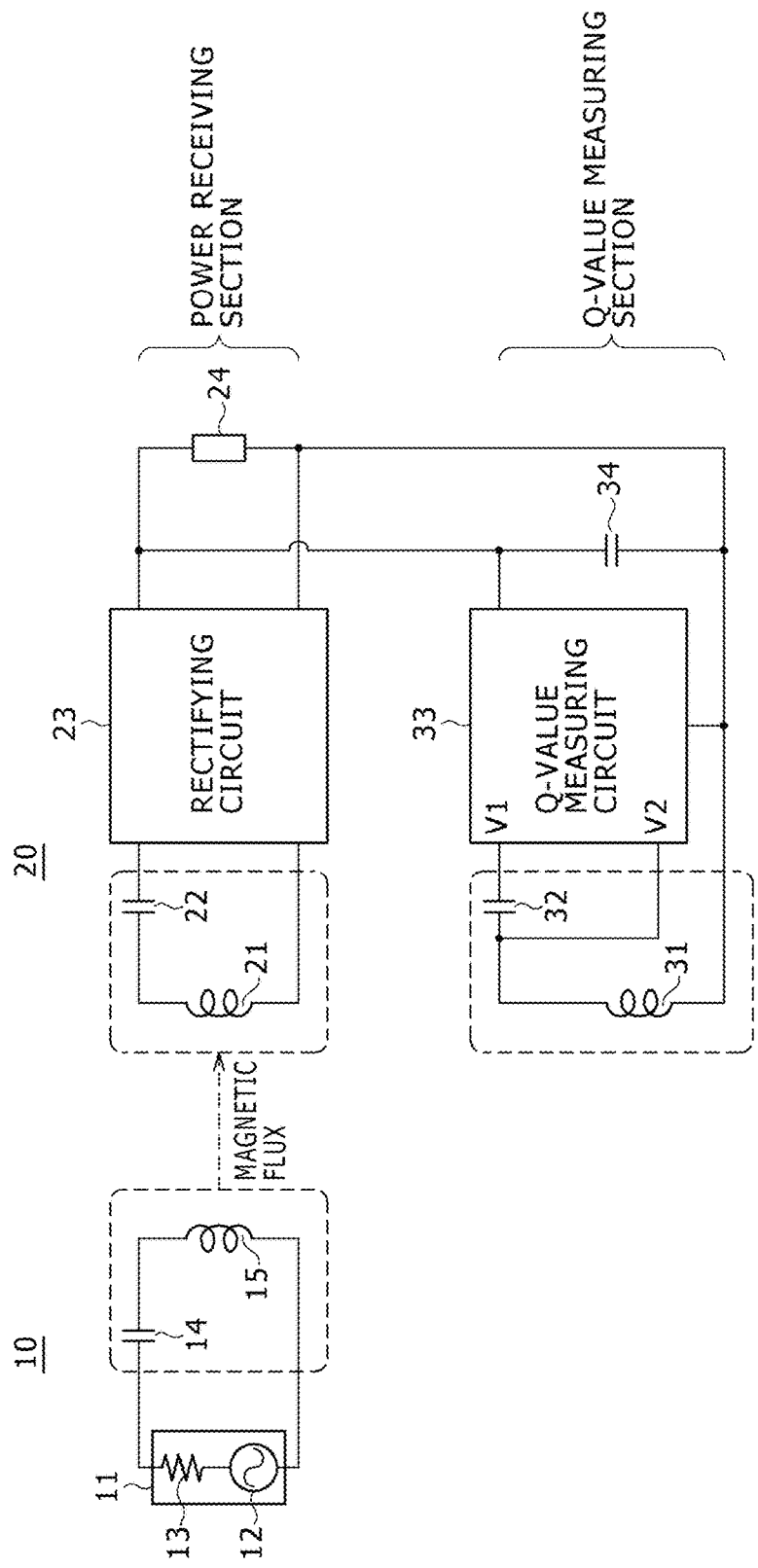
FIG. 1 is a schematic circuit diagram showing an example of a noncontact power transmission system that detects a metallic foreign matter by the measurement of a Q-value.

Embodiments for carrying out the present disclosure will hereinafter be described with reference to the accompanying drawings. Incidentally, repeated description of constituent elements having substantially the same functions or constitutions in the present specification and the drawings will be omitted by identifying the constituent elements by the same reference symbols.

Incidentally, description will be made in the following order.

1. Introductory Description

2. First Embodiment (Detecting System: Exciting Coil, Detecting Coil, and Reading Coil)

3. Second Embodiment (Detecting System: Example of Application to Noncontact Power Transmission System)

4. Third Embodiment (Power transmitting device: Example in which Power Transmitting Coil Also Serves as Reading Coil)

5. Fourth Embodiment (Detecting System: Example in which Wireless Feeding Pad and Portable Apparatus are Separated from Detecting System)

6. Others

1. Introductory Description

[Detection of Metallic Foreign Matter by Q-Value Measurement]

Methods for detecting a metallic foreign matter present between a power transmitting side and a power receiving side with high accuracy include a method of measuring the Q-value (Quality factor) of a circuit including a coil electromagnetically coupled with the outside, and determining whether a metallic foreign matter is present or absent in the vicinity of the coil on the basis of a result of the measurement of the Q-value. This method utilizes a fact that the Q-value of a resonant circuit is decreased when a metal approaches the resonant circuit.

The Q-value is an index indicating relation between the retention and a loss of energy, and is generally used as a value indicating the sharpness of a peak of resonance (strength of resonance) of a resonant circuit.

A metallic foreign matter refers to a circuit including a conductor such as a metal or the like or an unintended coil present between the power transmitting side and the power receiving side. Conductors referred to in the present specification also include conductors in a broad sense, that is, semiconductors. Detecting a circuit including a conductor such as a metal or the like or a coil will hereinafter be referred to also as "detecting a conductor or the like."

For highly accurate detection of a metallic foreign matter by using a method of measuring the Q-value of a resonant circuit, it is desirable to measure the Q-value of a resonant circuit on the power receiving side as an apparatus to be charged (secondary side) rather than a resonant circuit on the power transmitting side (primary side) on which the apparatus to be charged is mounted. This is for the following reasons.

(1) When a power receiving device is placed in the vicinity of the resonant circuit on the power transmitting side, the Q-value of the resonant circuit on the power transmitting side is decreased due to an effect of the metal of a casing of the power receiving device. Thus, it cannot be distinguished whether a factor in decreasing the Q-value is an effect of a foreign metal or an effect of the metal of the casing of the power receiving device.

(2) The Q-value of the resonant circuit on the power receiving side does not change even when a power transmitting device having a nonmetallic casing is placed in the vicinity of the resonant circuit on the power receiving side.

(3) The resonant circuit on the power receiving side is included in a portable apparatus or the like, and is small as compared with the resonant circuit on the power transmitting side. Thus, because of the physical size and a high magnetic flux density, the resonant circuit on the power receiving side is greatly affected by a foreign metal.

Description in the following will be made of an example of a noncontact power transmission system in which a metallic foreign matter is detected by the measurement of a Q-value.

The noncontact power transmission system shown in FIG. 1 includes a power transmitting device 10 and a power receiving device 20. The circuit shown in FIG. 1 is a circuit shown schematically to describe outlines of detection of a metallic foreign matter by the measurement of a Q-value.

The power transmitting device 10 includes a signal source 11 including a signal generator 12 for generating an alternating-current signal and a resistance element 13, a capacitor 14, and a power transmitting coil 15 (primary side coil). The resistance element 13 is a diagrammatic representation of an internal resistance (output impedance) of the signal generator 12.

In the present example, the capacitor 14 and the power transmitting coil 15 are connected to the signal source 11 so as to form a series resonant circuit. The value of capacitance (C-value) of the capacitor 14 and the value of inductance (L-value) of the power transmitting coil 15 are adjusted so that resonance occurs at a frequency at which feeding is desired to be performed. A power transmitting section is formed including the signal source 11 and the capacitor 14. A power transmission signal supplied from the power transmitting section is transmitted to the outside wirelessly through the power transmitting coil 15 on a noncontact basis.

The power receiving device 20 is divided into two functions of a power receiving section for receiving power from the power transmitting device 10 on a noncontact basis and a Q-value measuring section for detecting a metallic foreign matter present between the power transmitting device 10 and the power receiving device 20.

The power receiving section includes a power receiving coil 21, a capacitor 22 forming a resonant circuit together with the power receiving coil 21, a rectifying circuit 23 for converting an alternating-current signal into a direct-current signal, and a load 24 such as a battery (secondary battery), a charging section, and the like not shown in the figures. The rectifying circuit 23 may be configured to perform a smoothing process in addition to a rectifying process.

The power receiving coil 21 and the capacitor 22 in the power receiving section in the present example are connected to each other so as to form a series resonant circuit. The value of inductance (L-value) of the power receiving coil 21 and the value of capacitance (C-value) of the capacitor 22 are adjusted so that resonance occurs at the feeding frequency. The power receiving section is supplied with power from the outside through the power receiving coil 21 on a noncontact basis.

The Q-value measuring section includes a Q-value measuring coil 31, a capacitor 32 forming a resonant circuit together with the Q-value measuring coil 31, a Q-value measuring circuit 33, and a capacitor 34 connected in parallel with the load 24.

The Q-value measuring coil 31 and the capacitor 32 in the Q-value measuring section in the present example are connected to each other so as to form a series resonant circuit. The value of inductance (L-value) of the Q-value measuring coil 31 and the value of capacitance (C-value) of the capacitor 32 are adjusted so that resonance occurs at a Q-value measuring frequency. The series resonant circuit is connected to the Q-value measuring circuit 33. Power with which the capacitor 34 is charged is used for power supply to the Q-value measuring circuit 33. The measurement of the Q-value of the resonant circuit by the Q-value measuring circuit 33 is a method used also in a measuring instrument (LCR meter).

Letting V1 be a voltage between the Q-value measuring coil 31 and the capacitor 32, and letting V2 be a voltage across the Q-value measuring coil 31, the Q-value value of the series resonant circuit is expressed by Equation (1). R is the value of a series resistance at a frequency f. When Voltage V2>>Voltage V1, the equation can be expressed by an approximation.

$$Q = \frac{1}{R}\sqrt{\frac{L}{C}} = \frac{V2}{V1}$$ [Equation 1]

The voltage V2 is obtained by multiplying the voltage V1 by about Q. The series resistance value R and the inductance value L shown in Equation (1) are known to change due to an approaching metal or an effect of an eddy current occurring in a metal. For example, when a piece of metal approaches the coil 31, the effective resistance value R is increased, so that the Q-value is decreased. That is, the Q-value and resonance frequency of the resonant circuit are greatly changed due to an effect of a metal present around the coil 31. Thus, by detecting this change, a piece of metal present in the vicinity of the coil 31 can be detected. In the present disclosure, the measurement of the Q-value can be applied to the detection of a metallic foreign matter inserted between the primary side and the secondary side.

A metallic foreign matter can be detected with high accuracy by using the above-described change in the Q-value irrespective of an electromagnetic induction system or a magnetic field resonance system. The Q-value of the coil disposed within the apparatus on the power receiving side (secondary side) in particular can be a parameter highly sensitive to a metallic foreign matter because positional relation between the metallic casing of the apparatus on the power receiving side and the coil is substantially fixed, and thus effects of the metallic casing on the coil can be removed. That is, the Q-value of the resonant circuit on the power receiving side is suitable for detecting a metallic foreign matter with high accuracy.

Incidentally, the Q-value is desirably measured in a state close to a no-load Q by disconnecting the load of the power receiving device 20 using a switch or the like and thus making a load on the power receiving device 20 as light as possible. The switch is preferably disposed between the rectifying circuit 23 and the load 24, for example.

However, the following is necessary to measure the Q-value of the resonant circuit on the power receiving side.

(1) The apparatus on the power receiving side needs to have a Q-value measuring circuit.

(2) A power transmission signal, which is a wave interfering with a measurement signal during the measurement of the Q-value, needs to be stopped, and the apparatus on the power receiving side needs to have a mechanism for operating on its own without being supplied with power during the measurement.

The two following methods are conceivable as methods for solving the above.

(A) The apparatus on the power receiving side has a power supply (battery) necessary for the measurement of the Q-value.

(B) The apparatus on the power receiving side has a capacitor (for example the capacitor 34 in FIG. 1) or a secondary battery for the measurement of the Q-value, and measures the Q-value by performing an operation (repeatedly as required) of "feeding the capacitor, stopping the feeding, and measuring the Q-value while supplied with power from the capacitor."

The method of the above (A) requires a secondary battery in the apparatus on the power receiving side. In addition, there is an inconvenience in that the Q-value measuring circuit 33 does not operate in a state of the secondary battery being discharged completely.

In the method of the above (B), operation on both of the power transmitting side and the power receiving side is complex, and the process is troublesome. Thus, hardware for the measurement of the Q-value and software for processing a measurement value are necessary on the power receiving side, but are unsuitable for a portable apparatus having only a small casing and a microcomputer with low specifications.

[Outlines of Present Disclosure]

Accordingly, the present disclosure proposes a metallic foreign matter detecting method that reads a magnetic flux generated by a detecting coil for detecting the magnetic field of an electromagnetic wave output from an exciting coil according to the magnetic field by a reading coil, and which measures the Q-value of the detecting coil on a basis of a temporal transition of oscillation of a voltage obtained in the reading coil according to the magnetic flux.

Suppose that there are a speaker, a tuning fork, and a microphone. An experiment is performed in which sound is emitted from the speaker to give energy to the tuning fork, and sound output by the tuning fork is collected by the microphone. A tuning fork having a high Q-value continues vibrating and sounding for a long period of time, while a tuning fork having a low Q-value stops vibrating and sounding after a short period of time. A resonant circuit (resonator) has a characteristic similar to this. The present disclosure uses this characteristic of a resonator to measure the Q-value electrically. After energy is given to the detecting coil by a magnetic field, a state of oscillation of the detecting coil is observed also magnetically on a noncontact basis by using the reading coil, and the Q-value of the detecting coil is measured.

2. First Embodiment

[Example of Configuration of Detecting System]

A detecting system for realizing the above-described metallic foreign matter detecting method will be described.

Figure 2:
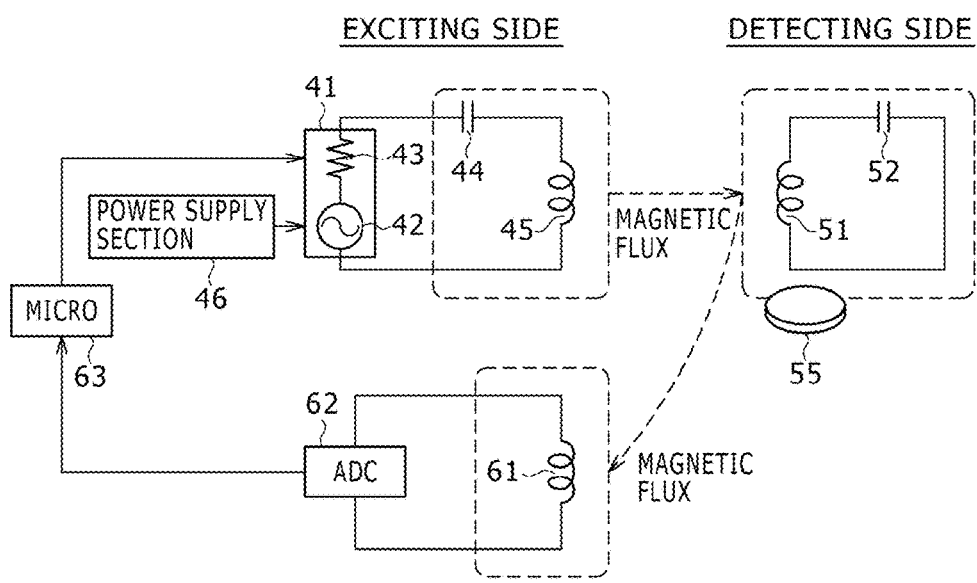
FIG. 2 is a schematic circuit diagram showing an example of configuration of a detecting system according to a first embodiment of the present disclosure.

FIG. 2 is a schematic circuit diagram showing an example of configuration of a detecting system according to a first embodiment of the present disclosure. A circuit shown in FIG. 2 is a basic configuration for describing outlines of detection of a metallic foreign matter by the measurement of the Q-value according to the first embodiment of the present disclosure. However, the present disclosure is not limited to this example.

The detecting system 40 according to the present embodiment is divided into two parts on an exciting side and a detecting side.

The exciting side includes an exciting section and a Q-value measuring section. The exciting section includes a signal source 41 including a signal generator 42 for generating an alternating-current signal and a resistance element 43, a capacitor 44, and an exciting coil 45 excited by the alternating-current signal generated by the signal generator 42. The resistance element 43 is a diagrammatic representation of an internal resistance (output impedance) of the signal generator 42.

Though different in output, ratings, and the like, these parts on the exciting side have similar functions to those of the signal source 11 including the signal generator 12 and the resistance element 13, the capacitor 14, and the exciting coil 15 of the power transmitting device 10 shown in FIG. 1, and have a similar connection configuration to that of FIG. 1.

The detecting side includes at least a resonator composed of a detecting coil 51 excited by a magnetic field output from the exciting coil 45 and a capacitor 52. However, the capacitor 52 is not necessary when a capacitance between lines within the detecting coil 51 or a parasitic capacitance component formed of a capacitance between the exciting coil 45 and the detecting coil 51 or the like is used. The detecting system 40 measures the Q-value on the basis of a magnetic flux generated by the detecting coil 51.

The exciting side further includes, as the Q-value measuring section, a reading coil 61 for detecting the magnetic flux generated by the detecting coil 51 on the detecting side, an analog-to-digital converter (hereinafter referred to as an ADC) 62, and a microcomputer (hereinafter referred to as a micro) 63. The ADC 62 takes in a current generated in the reading coil 61 according to a change in the magnetic flux, subjects the current to analog-to-digital conversion, and calculates a voltage applied across the reading coil 61. A voltage signal converted into a digital signal by the ADC 62 is input to the micro 63. The micro 63 is an arithmetic processing device for controlling the whole of the exciting side, such as controlling the operation of the signal source 41 and the like. Details of the micro 63 will be described later.

Incidentally, the exciting side has a power supply section 46 for supplying power to parts such as the signal source 41, the ADC 62, the micro 63, and the like.

A configuration and operation relating to the detection of a metallic foreign matter by the micro 63 will be described in the following.

Figure 3:
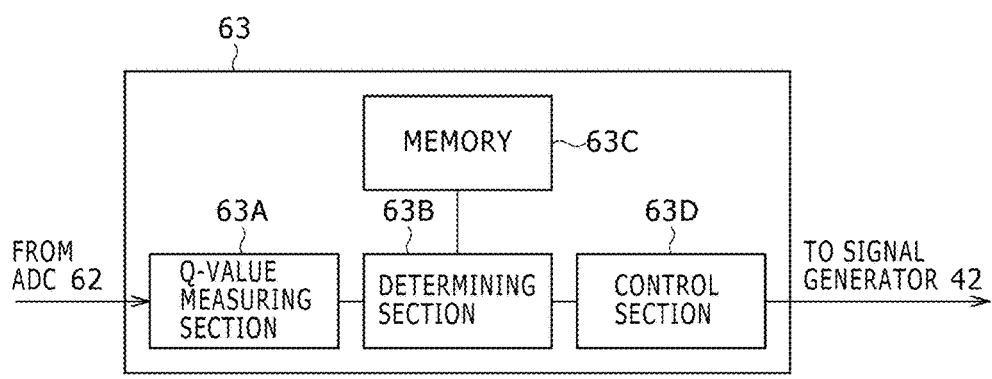
FIG. 3 is a block diagram showing an example of internal configuration of a microcomputer shown in FIG. 2.

FIG. 3 is a block diagram showing an example of internal configuration of the micro 63.

The micro 63 in the present embodiment includes a Q-value measuring section 63A, a determining section 63B, a memory 63C, and a control section 63D.

The Q-value measuring section 63A is an example of a Q-value measuring section. The Q-value measuring section 63A is supplied with the digital voltage signal from the ADC 62, obtains a Q-value by calculation to be described later using the voltage signal, and outputs the obtained Q-value to the determining section 63B. The amplitude, that is, the oscillation of the voltage signal input from the ADC 62 makes a temporal transition (attenuates) according to the magnetic flux output by the detecting coil 51. The Q-value measuring section 63A calculates the Q-value on the basis of the temporal transition of the oscillation of the voltage signal.

The determining section 63B is an example of a determining section. The determining section 63B determines whether or not a metallic foreign matter is present in the vicinity of the detecting coil 51 by comparing the Q-value obtained by the Q-value measuring section 63A with a preset reference value, and outputs a result of the determination to the control section 63D. A state of electromagnetic coupling between the detecting coil 51 and the exciting coil 45 can be estimated by thus comparing the Q-value of the detecting coil 51 with the reference value. Therefore, whether a metallic foreign matter is present or absent between the exciting side (for example the power transmitting coil of the power transmitting device) and the detecting side (for example the power receiving coil of the power receiving device) can be determined by setting the reference value to an appropriate value.

The memory 63C is an example of a nonvolatile storage section. The memory 63C stores the reference value for the Q-value of the detecting coil 51 at each frequency set in advance in a state of nothing being present in the vicinity of the detecting coil 51 or nothing being present between the detecting coil 51 and the exciting coil 45. The memory 63C may also store an ID number (identifying information) assigned to each exciting side (for example each power transmitting device), an ID number obtained from the detecting side (for example the power receiving device), and the like.

The control section 63D is an example of a control section. The control section 63D controls the exciting side (for example the power transmitting device) and noncontact power transmission on the basis of the result of the determination which result is input from the determining section 63B. When the determining section 63B determines that a metallic foreign matter 55 is present between the detecting coil 51 and the exciting coil 45, the control section 63D for example sends a stop signal to the power transmitting device, and performs control to stop the output of a power transmission signal from the signal source of the power transmitting device.

Incidentally, while an example in which the Q-value measuring section 63A, the determining section 63B, and the control section 63D are housed in one micro 63 has been shown, a combination of one or more of these sections may be housed in another arithmetic processing section to perform distributed processing.

In the above-described configuration, the signal generator 42 on the exciting side generates a burst wave as an example of an electromagnetic wave. The electromagnetic wave according to the burst wave is transmitted from the exciting coil 45 to the outside. Thereby energy is given to the circuit including the detecting coil 51 on the detecting side. After the transmission of the burst wave on the exciting side is stopped, the detecting coil 51 detects a magnetic field generated by the burst wave, and generates a magnetic flux according to the detected magnetic field.

The oscillation of the magnetic flux (change in the magnetic flux) generated by the detecting coil 51 is detected by the reading coil 61. A voltage signal according to the oscillation is input to the ADC 62. The ADC 62 converts the analog voltage signal input from the reading coil 61 into a digital voltage signal. The digital voltage signal is input to the micro 63.

The Q-value measuring section 63A in the micro 63 analyzes a temporal transition of the oscillation of the voltage signal input from the ADC 62, and calculates the Q-value of the detecting coil 51.

Then, the determining section 63B compares the Q-value with the reference value stored in the memory 63C, and thereby determines whether or not a metallic foreign matter is present in the vicinity of the detecting coil 51, that is, between the detecting coil 51 and the exciting coil 45. For example, the determining section 63B determines that there is no metallic foreign matter when the Q-value is equal to or more than the reference value, and the determining section 63B determines that there is a metallic foreign matter when the Q-value is less than the reference value.

[Results of Simulation]

Description will next be made of results obtained by simulating the detecting system in the first embodiment of the present disclosure.

Figure 4:
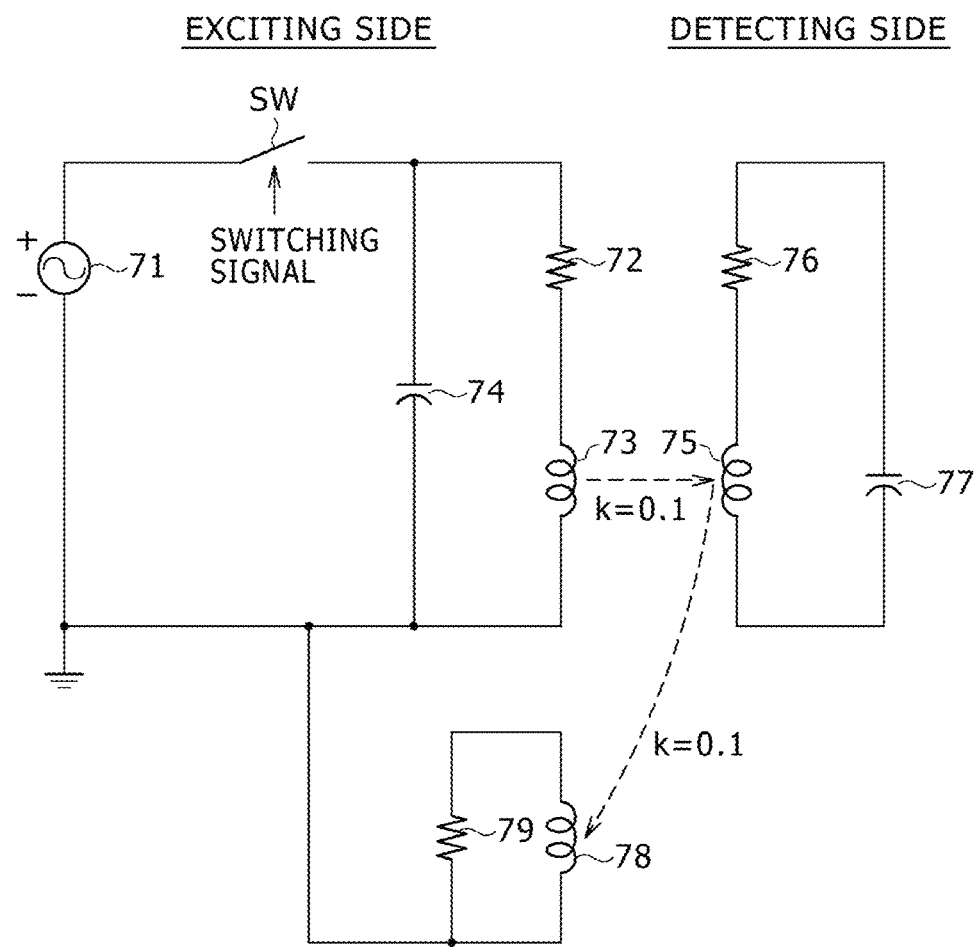
FIG. 4 is a schematic circuit diagram in which a detecting system is modeled.

FIG. 4 is a schematic circuit diagram in which the detecting system is modeled.

An exciting side has a resonant circuit formed by connecting an exciting coil 73, a resistance element 72, and a capacitor 74 to a closed circuit. A midpoint of connection between the resistance element 72 and the capacitor 74 of the resonant circuit and one terminal of a signal generator 71 are connected to each other via a switch SW. In addition, a midpoint of connection between the exciting coil 73 and the capacitor 74 and another terminal of the signal generator 71 are connected to each other, and grounded.

In addition, a reading coil 78 for reading the oscillation of a voltage signal and a resistance element 79 form a closed circuit. A midpoint of connection between the reading coil 78 and the resistance element 79 is grounded.

A detecting side has a resonant circuit formed by connecting a detecting coil 75, a resistance element 76, and a capacitor 77 to a closed circuit.

Letting Ls [H] be the inductance of the exciting coil 73, and letting Cs [F] be the capacitance of the capacitor 74, the resistance value R of the resistance element 72 is set at √(Ls/Cs)/Qs, where Qs is the Q-value of the resonant circuit.

Letting Ld [H] be the inductance of the detecting coil 75, and letting Cd [F] be the capacitance of the capacitor 77, the resistance value R of the resistance element 76 is set at √(Ld/Cd)/Qd, where Qd is the Q-value of the resonant circuit.

The signal generator 71 generates a sinusoidal signal with an amplitude of 1 V and a frequency of 10 MHz. The switch SW performs an operation of being turned on for a period of 1 μsec, for example, in cycles of 200 μsec according to a switching signal (pulse signal). While the period of 1 μsec is set for the excitation of the resonant circuit of the exciting coil 73, and the cycles are set at 200 μsec, the present disclosure is not limited to this example.

A coupling coefficient k between the exciting coil 73 and the detecting coil 75 and a coupling coefficient k between the detecting coil 75 and the reading coil 78 are both 0.1.

In the above-described configuration and settings, a burst wave is generated by making the switch SW perform switching operation on the sinusoidal signal output from the signal generator 71 in the above-described cycles, and is supplied to the resonant circuit including the exciting coil 73. Then, the exciting coil 73 gives energy to the resonant circuit on the detecting side which resonant circuit is composed of the detecting coil 75, the resistance element 76, and the capacitor 77.

After the burst wave on the exciting side is stopped, the oscillation of the resonant circuit on the detecting side is detected by the reading coil 78, and the Q-value is measured.

Incidentally, in the present simulation, the capacitor 74 is not used. Also in actual use, the capacitor (for example the capacitor 44 or 74) does not necessarily needs to be provided on the exciting side when the burst wave generated by the signal generator has high power and the detecting coil on the detecting side can be sufficiently excited at the time of generation of the burst wave. That is, excitation may be performed by the exciting coil alone without the capacitor being used on the exciting side from the beginning. In addition, when the capacitor 74 is used during the excitation, the capacitor 74 is desirably disconnected so as not to form the resonant circuit after the excitation. In addition, the switch SW is provided between the signal generator 71 and the capacitor 74. However, when the switch SW is connected between the capacitor 74 and the resistance element 72, a state of the resonant circuit not being formed can be created intermittently in parallel with the generation of the burst wave.

Figure 5A:
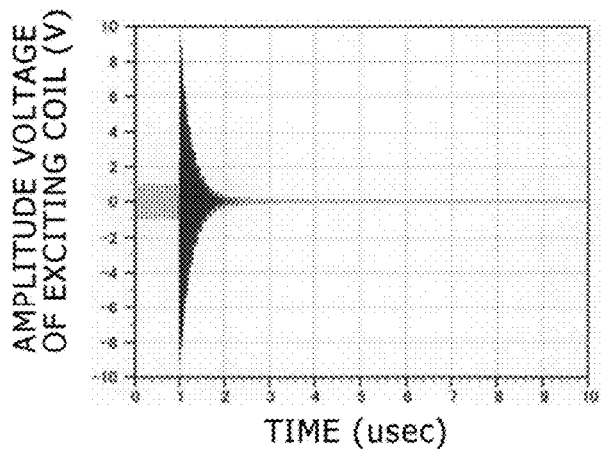
FIGS. 5A, 5B, and 5C show examples of voltage waveforms obtained at respective parts when the Q-value on a detecting side without a metallic foreign matter is 100, FIG. 5A showing an example of the amplitude voltage of an exciting coil, FIG. 5B showing an example of the amplitude voltage of a detecting coil, and FIG. 5C showing an example of a temporal transition of the amplitude voltage of a reading coil.
Figure 5B:
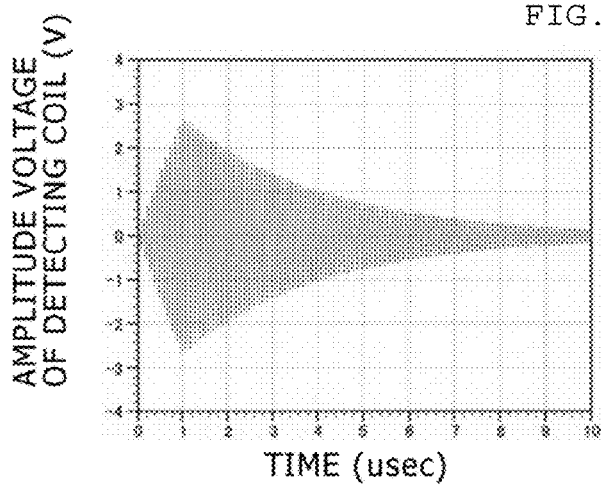
Figure 5C:
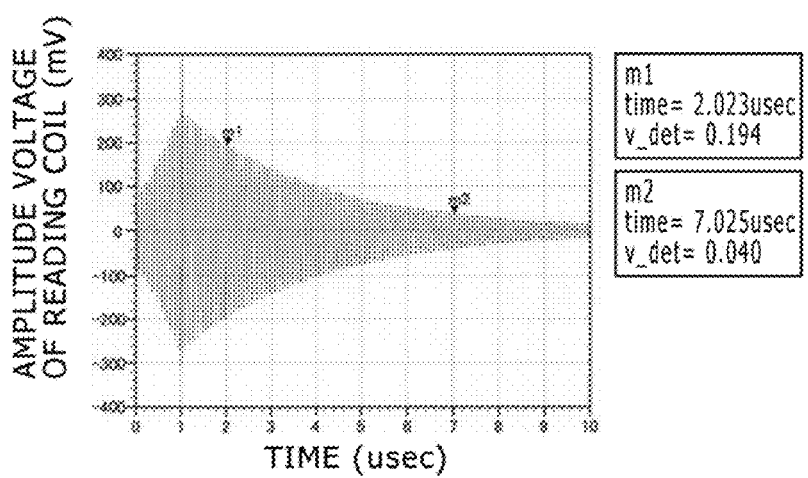

FIGS. 5A, 5B, and 5C show examples of voltage waveforms obtained at respective parts when the Q-value on the detecting side without a metallic foreign matter is 100. FIG. 5A show an example of the amplitude voltage [V] of the exciting coil 73. FIG. 5B shows an example of the amplitude voltage [V] of the detecting coil 75. FIG. 5C shows an example of a temporal transition of the amplitude voltage [mV] of the reading coil 78. An axis of abscissas in each of FIGS. 5A to 5C indicates time [μsec].

As shown in FIG. 5A, the burst wave is supplied to the exciting coil 73 for a period of 0 to 1 μsec during which the switch SW is on. The waveform of the amplitude voltage of the exciting coil 73 therefore oscillates with an amplitude of 1 V and a frequency of 10 MHz. Then, the amplitude signal of the exciting coil 73 is amplified by the resonant circuit immediately after the 1 μsec, that is, immediately after the switch SW is turned off, but is thereafter attenuated sharply to become a value close to zero.

As shown in FIG. 5B, the waveform of the amplitude voltage of the detecting coil 75 is increased in amplitude during the period of 0 to 1 μsec during which the detecting coil 75 is excited. After the 1 μsec, the excitation stops, and the waveform of the amplitude voltage of the detecting coil 75 is attenuated.

As shown in FIG. 5C, the waveform of the amplitude voltage of the reading coil 78 is increased in amplitude during the period of 0 to 1 μsec during which the detecting coil 75 is excited. After the 1 μsec, the excitation stops, and the waveform of the amplitude voltage of the reading coil 78 is attenuated as in the case of the detecting coil 75.

Let f be the frequency of a power transmission signal transmitted from the exciting side to the detecting side, let $V_1$ be the value of a voltage obtained in the reading coil 78 at a measurement point m1 (time $t_1$) on the waveform of the amplitude voltage of the reading coil 78 in FIG. 5C, and similarly let $V_2$ be the value of a voltage obtained in the reading coil 78 at a measurement point m2 (time $t_2$) after the passage of a time from the measurement point m1. The Q-value of the reading coil 78 at this time is obtained by the following equation.

$$Q = \pi f \cdot \frac{t_2 - t_1}{\ln\left(\frac{V_1}{V_2}\right)} \quad \text{[Equation 2]}$$

Description in the following will be made briefly of a process of deriving an equation for obtaining the Q-value from the amplitudes (voltage values) at two times of the time response waveform of the voltage obtained in the reading coil.

First, energy given from the exciting side to the detecting side is expressed by Equation (3).

Energy $E = |a(t)|^2, a(t) = A \cdot e^{-\Gamma t} \cdot e^{j\omega t}$

Oscillation Term: $e^{j\omega t}(|e^{j\omega t}|) = 1$

Consideration will next be given to power. However, the oscillation term will be omitted in the following for simplicity, and will be expressed by Equation (4). Equation (4) represents only the term of an envelope.

$$a(t) = A \cdot e^{-\Gamma t} \quad \text{[Equation 4]}$$

$$\therefore E = A^2 \cdot e^{-2\Gamma t} \quad \text{[Equation 5]}$$

Power P is "energy used in a unit time." Thus, power P can be expressed as in Equation (6).

$$P = -\frac{d}{dt}E = -\frac{d}{dt}(A^2 \cdot e^{-2\Gamma t}) = 2\Gamma(A^2 \cdot e^{-2\Gamma t}) = 2\Gamma E \quad \text{[Equation 6]}$$

When the Q-value is defined as "internal energy of a resonant system divided by energy lost by the resonant system during one cycle," the following equation can be derived from the power P shown in the above Equation (6).

$$Q \equiv \frac{\text{Internal Energy of Resonant System}}{\text{Energy Lost by Resonant System during 1 rad}} \quad \text{[Equation 7]}$$

$$= \frac{E}{P \cdot \frac{1}{\omega}} = \frac{\omega E}{P} = \frac{\omega E}{2\Gamma E} = \frac{\omega}{2\Gamma}$$

-continued $$\therefore \Gamma = \frac{\omega}{2Q} \quad \text{[Equation 8]}$$

$$\therefore a(t) = A \cdot e^{-\frac{\omega}{2Q}t} \quad \text{[Equation 9]}$$

Further, Equations (10) to (12) are derived from Equation (9).

$$\frac{|a(t_1)|}{|a(t_2)|} = \frac{A \cdot e^{-\frac{\omega}{2Q}t_1}}{A \cdot e^{-\frac{\omega}{2Q}t_2}} = e^{-\frac{\omega}{2Q}(t_1 - t_2)} \quad \text{[Equation 10]}$$

$$\ln\left\{\frac{|a(t_1)|}{|a(t_2)|}\right\} = \frac{\omega}{2Q}(t_2 - t_1) \quad \text{[Equation 11]}$$

$$\therefore Q = \frac{\omega}{2} \cdot \frac{t_2 - t_1}{\ln\left\{\frac{|a(t_1)|}{|a(t_2)|}\right\}} = \pi f \cdot \frac{t_2 - t_1}{\ln\left\{\frac{|a(t_1)|}{|a(t_2)|}\right\}} \quad \text{[Equation 12]}$$

[Results of Calculation of Q-Value]

When data on the measurement points m1 ($t_1$=2.023 μsec, $V_1$=0.194 mV) and m2 ($t_2$=7.025 μsec, $V_2$=0.040 mV) in FIG. 5C is applied to the above equations, the Q-value of the reading coil 78 is calculated as follows.

$$Q = \pi f \cdot \frac{t_2 - t_1}{\ln\left(\frac{V_1}{V_2}\right)} \quad \text{[Equation 13]}$$

$$= \pi \cdot 10 \times 10^6 \cdot \frac{7.025 \times 10^{-6} - 2.023 \times 10^{-6}}{\ln\left(\frac{0.194}{0.040}\right)}$$

$$= 99.52$$

As a result of analysis, the Q-value=99.52 is obtained. It is shown that a value close to the Q-value set for a case without a metallic foreign matter (=100) is obtained, and that the Q-value can be obtained with high accuracy.

Therefore, the method of detecting a magnetic flux generated by the detecting coil receiving the magnetic field of an electromagnetic wave output from the exciting coil according to the magnetic field by the reading coil and using the magnetic flux to measure the Q-value according to the embodiment of the present disclosure can detect a metallic foreign matter with high accuracy.

Figure 6A:
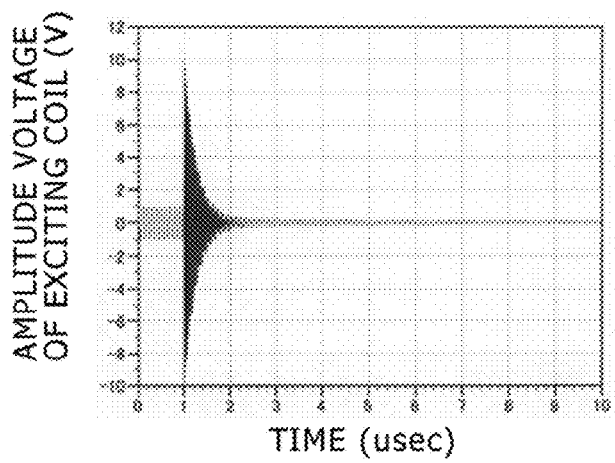
FIGS. 6A, 6B, and 6C show examples of the voltage waveforms obtained at the respective parts when the Q-value on the detecting side without a metallic foreign matter is 200, FIG. 6A showing an example of the amplitude voltage of the exciting coil, FIG. 6B showing an example of the amplitude voltage of the detecting coil, and FIG. 6C showing an example of a temporal transition of the amplitude voltage of the reading coil.
Figure 6B:
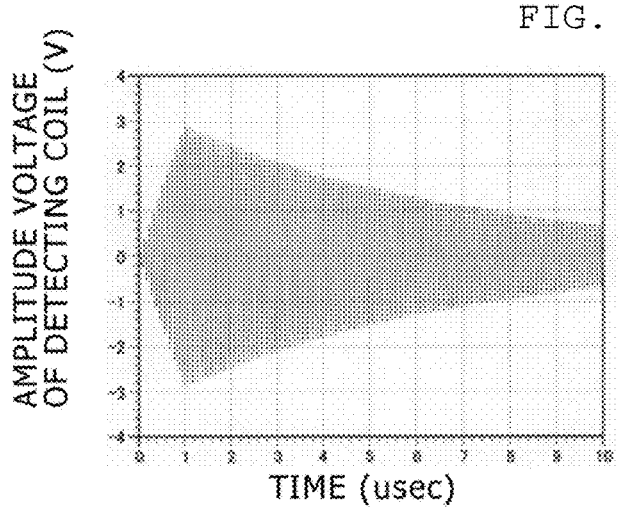
Figure 6C:
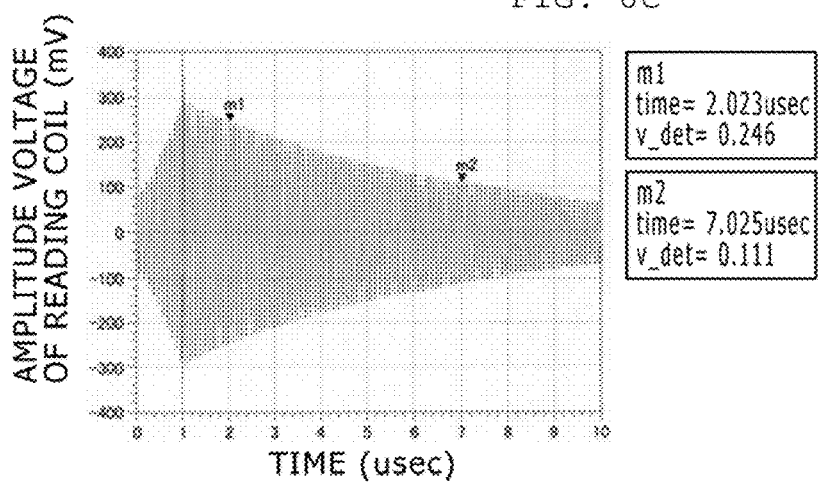

FIGS. 6A, 6B, and 6C show examples of voltage waveforms obtained at respective parts when the Q-value on the detecting side without a metallic foreign matter is 200. FIG. 6A show an example of the amplitude voltage of the exciting coil. FIG. 6B shows an example of the amplitude voltage of the detecting coil. FIG. 6C shows an example of a temporal transition of the amplitude voltage of the reading coil.

As shown in FIG. 6A, the waveform of the amplitude voltage of the exciting coil 73 is the same as in FIG. 5A.

As shown in FIG. 6B and FIG. 6C, the waveform of the amplitude voltage of the detecting coil 75 and the waveform of the amplitude voltage of the reading coil 78 are attenuated in shapes similar to those of FIG. 5B and FIG. 5C. However, the attenuation progresses slowly because of the high Q-value of 200.

As in the above-described case of Q=100, when data on the measurement points m1 ($t_1$=2.023 μsec, $V_1$=0.246 mV) and m2 ($t_2$=7.025 μsec, $V_2$=0.111 mV) in FIG. 6C is applied to the above equations, the Q-value of the reading coil 78 is calculated as follows.

$$Q = \pi f \cdot \frac{t_2 - t_1}{\ln\left(\frac{V_1}{V_2}\right)} \quad \text{[Equation 14]}$$

$$= \pi \cdot 10 \times 10^6 \cdot \frac{7.025 \times 10^{-6} - 2.023 \times 10^{-6}}{\ln\left(\frac{0.246}{0.111}\right)}$$

$$= 197.46$$

As a result of analysis, the Q-value=197.46 is obtained. It is shown that a value close to the Q-value set for a case without a metallic foreign matter (=200) is obtained, and that the Q-value can be obtained with high accuracy irrespective of the set Q-value.

The detecting system according to the first embodiment described above detects a magnetic flux generated by the detecting coil according to the magnetic field of an electromagnetic wave output from the exciting coil by the reading coil, analyzes a temporal transition of oscillation of the voltage obtained in the reading coil according to the magnetic flux, and measures the Q-value of the detecting coil. It is therefore possible to detect the presence or absence of a metallic foreign matter with high accuracy on a noncontact basis without providing hardware for the measurement of the Q-value or software for processing a measurement value on the detecting side.

In addition, when the reading coil is disposed on the exciting side, a power supply for excitation can serve also as a power supply necessary for the measurement of the Q-value. Therefore a battery or the like necessary for a Q-value measuring circuit and operation on its own on the detecting side is rendered unnecessary.

A detecting system according to an embodiment of the present disclosure is basically configured using three coils.

(1) An exciting coil
(2) A detecting coil
(3) A reading coil

The detecting system may be applied in several forms to noncontact power transmission systems or the like.

Supposing that coils used for power transmission in a noncontact power transmission system are (4) a power transmitting coil and (5) a power receiving coil, the following combinations are conceivable.

The exciting coil (1) serves also as the power transmitting coil (4).

The detecting coil (2) serves also as the power receiving coil (5).

The exciting coil (1) serves also as the reading coil (3).

A plurality of combinations of the above cases where the coils serve double purposes/cases where the coils do not serve double purposes (for example a combination of (4), (1), and (3)).

Description in the following will be made of a few concrete examples in which a detecting system according to an embodiment of the present disclosure is applied to a noncontact power transmission system.

3. Second Embodiment

[Example of Configuration of Noncontact Power Transmission System]

Figure 7:
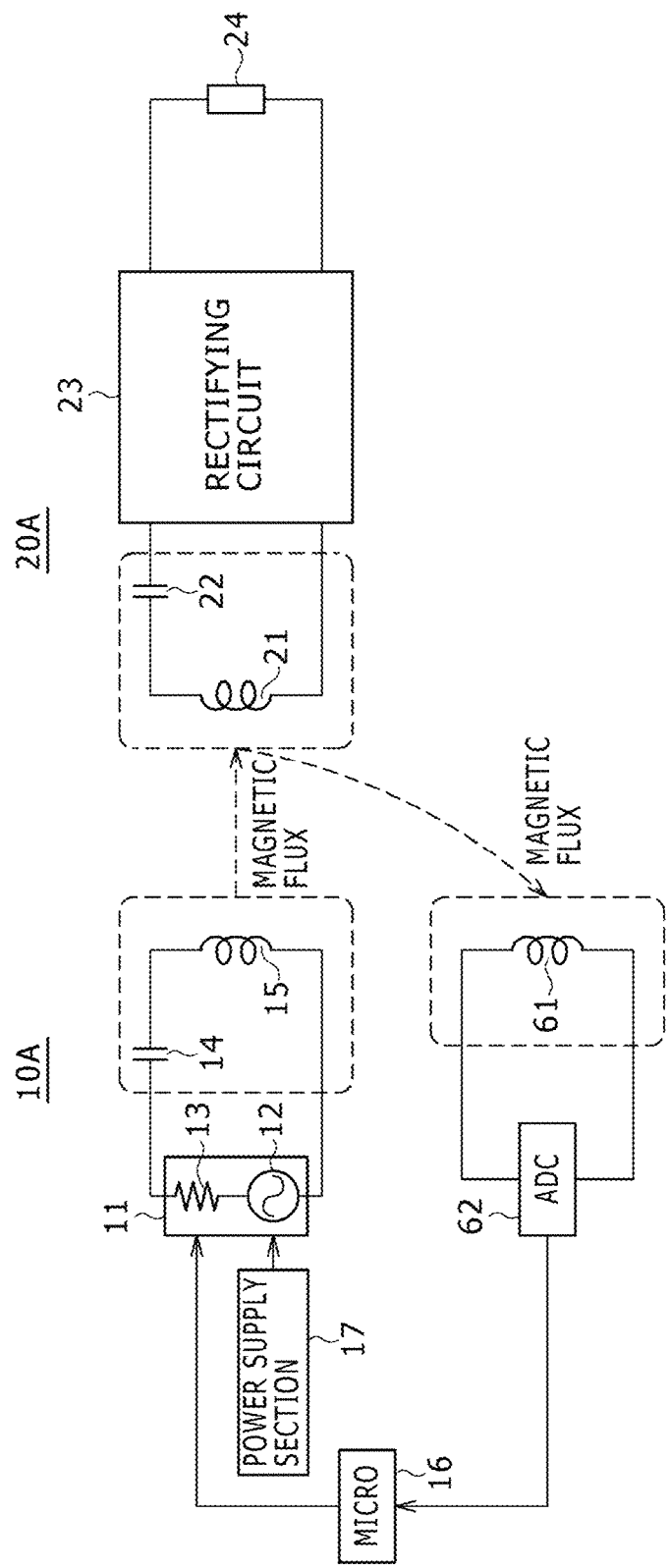
FIG. 7 is a schematic circuit diagram showing an example of configuration of a noncontact power transmission system according to a second embodiment of the present disclosure.

FIG. 7 is a schematic circuit diagram showing an example of configuration of a noncontact power transmission system to which a detecting system according to an embodiment of the present disclosure is applied. Repeated description of constituent elements in FIG. 7 which constituent elements have substantially the same functions or constitutions as in FIG. 1 and FIG. 2 will be omitted by identifying the constituent elements by the same reference numerals.

A power transmitting device 10A of the noncontact power transmission system shown in FIG. 7 is formed by adding a reading coil 61 to the power transmitting device 10 shown in FIG. 1. The reading coil 61 is configured to detect a magnetic flux generated by a power receiving coil 21 (secondary side coil) according to a magnetic field received by the power receiving coil 21 from a power transmitting coil 15 (primary side coil). A power receiving device 20A is configured by omitting a Q-value measuring function from the power receiving device 20 shown in FIG. 1. A resonant circuit including the power receiving coil 21 resonates with the magnetic field of a power transmission signal output from the power transmitting coil 15, and generates a magnetic flux according to the resonance. In the present embodiment, the power transmitting coil serves also as an exciting coil in the power transmitting device 10A, and the power receiving coil serves also as a detecting coil in the power receiving device 20A.

In the noncontact power transmission system of such a configuration, under control of a micro 16, a burst wave is generated by a signal generator 12, and an electromagnetic wave according to the burst wave is transmitted from the power transmitting coil 15 (doubling as the exciting coil) to the outside. After the transmission of the burst wave of the power transmitting device 10A is stopped, the power receiving coil 21 (doubling as the detecting coil) detects a magnetic field generated according to the burst wave, and generates a magnetic flux according to the detected magnetic field.

Then, a voltage generated in the reading coil 61 according to changes in the magnetic flux output from the power receiving coil 21 of the power receiving device 20A is input to an ADC 62 to be converted from an analog to a digital signal. The functions of the ADC 62 are the same as those of the ADC 62.

Then, the voltage signal converted into the digital signal is input to the micro 16 for controlling the whole of the power transmitting device 10A, and the measurement of the Q-value and the determination of a metallic foreign matter are performed. The configuration and functions of the micro 16 are similar to those of the micro 63.

A power supply section 17 has similar functions to those of the power supply section 46 and produces high power. The power supply section 17 supplies power to parts within the power transmitting device 10A such as the signal source 11, the ADC 62, and the micro 63.

Incidentally, the power transmitting device 10A and the power receiving device 20A in the example shown in FIG. 7 both have a configuration including a series resonant circuit composed of a coil and a capacitor. However, various forms are conceivable for the detailed configuration when provided with the functions of a resonant circuit. For example, various configurations such as a series connection or a parallel connection of a coil and a capacitor or a combination of a series connection and a parallel connection can be adopted.

According to the second embodiment, as in the first embodiment, the Q-value of the circuit including the power receiving coil of the power receiving device can be measured on a noncontact basis without hardware for the measurement of the Q-value or software for processing a measurement value being provided to the power receiving device (detecting side). Therefore whether or not a metallic foreign matter is present in the vicinity of the power receiving device, that is, between the power receiving device and the power transmitting device can be determined on a noncontact basis with high accuracy. The second embodiment is effective especially when applied to a power receiving device (portable apparatus) having only a casing with a small space for mounting parts and an arithmetic processing device with a low processing power.

In addition, as in the first embodiment, when the reading coil is disposed in the power transmitting device (exciting side), the excitation of the power transmitting coil and the measurement of the Q-value by the ADC and the micro can be performed using a power supply for noncontact power transmission. Therefore a battery or the like necessary for a Q-value measuring circuit and operation on its own in the power receiving device (detecting side) is rendered unnecessary.

4. Third Embodiment

A third embodiment is an example in which the power transmitting coil 15 in the power transmitting device 10A according to the second embodiment (see FIG. 7) serves also as the reading coil 61.

Figure 8:
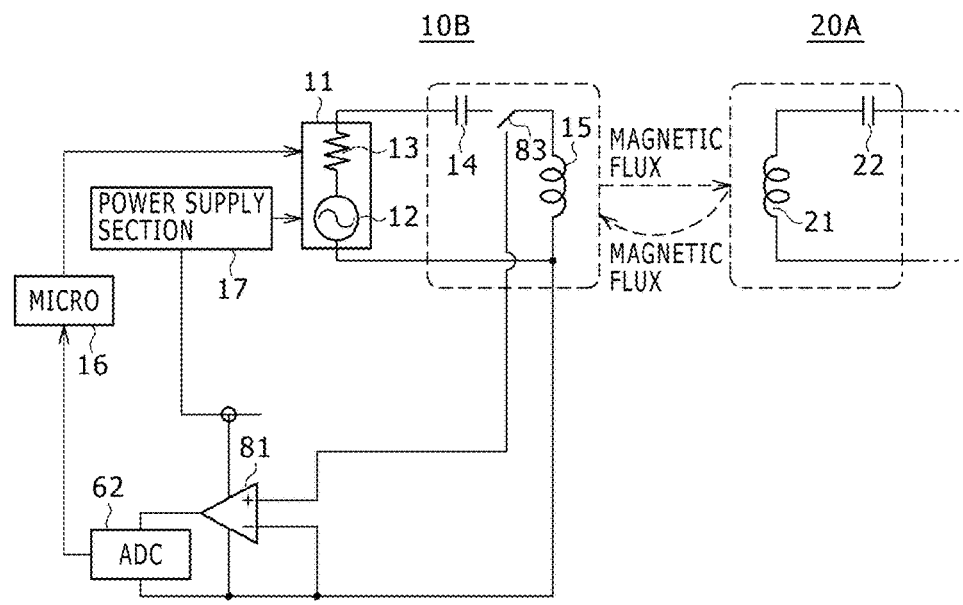
FIG. 8 is a schematic circuit diagram showing an example of configuration of a noncontact power transmission system according to a third embodiment of the present disclosure.

FIG. 8 is a schematic circuit diagram showing an example of configuration of a noncontact power transmission system according to a third embodiment of the present disclosure.

A power transmitting device 10B shown in FIG. 8 has a switch 83 (an example of a switching section) so that a power transmitting coil 15 is used both as a power transmitting coil and as a reading coil. A circuit connected to the power transmitting coil 15 is switched between the side of a power transmitting section and the side of a Q-value measuring section according to a switching signal from the control section of a micro 16. Incidentally, a switching element such as a transistor, a MOSFET, or the like can be applied as an example of the switch 83.

In addition, a buffer amplifier 81 is provided. Both terminals of the power transmitting coil 15 are connected to the positive and negative input terminals of the buffer amplifier 81 via the switch 83. The output of the buffer amplifier 81 is output to an ADC 62. The buffer amplifier 81 thereby performs impedance conversion. Power to the buffer amplifier 81 is supplied from a power supply section 17.

When the power transmitting coil 15 is used as both a power transmitting coil and a detecting coil, the switch 83 is switched by the micro 16 to connect a capacitor 14 to the power transmitting coil 15 during power transmission. During the measurement of the Q-value, the switch 83 is switched by the micro 16 to connect the power transmitting coil 15 to the buffer amplifier 81.

According to the third embodiment, one coil is used as both a power transmitting coil and a detecting coil. Thus, the number of coils is reduced by one, and the power transmitting device is made smaller and thinner.

5. Fourth Embodiment

A present embodiment is an example in which a detecting system is provided as a separate system to a noncontact power transmission system. A circuit including a coil for metal detection may be provided separately from a resonant circuit for receiving power in a power receiving device, and the Q-value of the circuit may be measured. Incidentally, the frequency of a signal input to the circuit for metal detection may be different from the resonance frequency of the resonant circuit for receiving power. Description in the following will be made of an example in which a coil for metal detection (detecting coil) is provided separately from a resonant circuit for receiving power on a power receiving side, and a foreign matter detecting device is provided as a system separate from a main body system on a power transmitting side.

Figure 9:
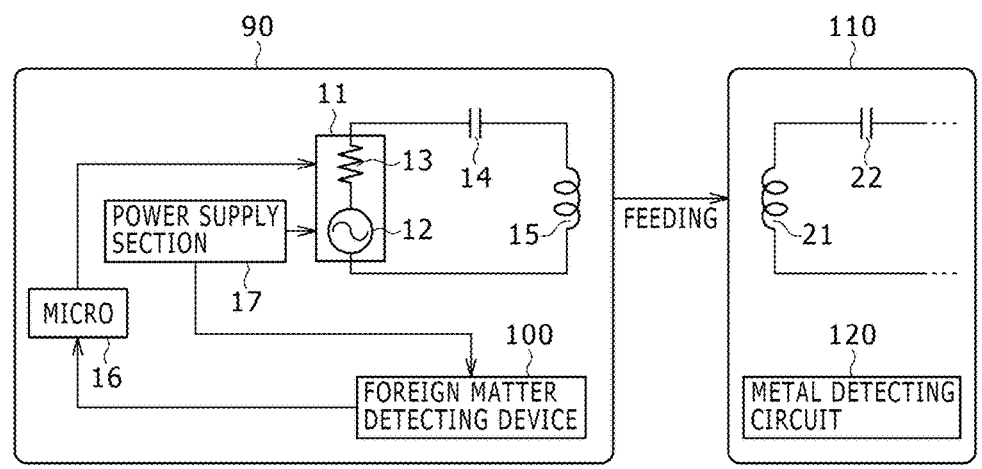
FIG. 9 is a schematic circuit diagram showing an example of configuration of a noncontact power transmission system (a wireless feeding mat and a portable apparatus) according to a fourth embodiment of the present disclosure.

FIG. 9 is a schematic circuit diagram showing an example of configuration of a noncontact power transmission system according to a fourth embodiment of the present disclosure.

A wireless feeding mat 90 shown in FIG. 9 has a flat external shape to be used as a charging device, and corresponds to the power transmitting devices (see FIG. 7 and FIG. 8) according to the second and third embodiments. In addition, the wireless feeding mat 90 includes a thin plate-shaped mounting section. The wireless feeding mat 90 identifies the position of a power receiving device such as a portable apparatus 110 or the like placed on the mounting section, is supplied with power from a commercial power supply or the like, and feeds the portable apparatus 110 placed on the mounting section on a noncontact basis. A foreign matter detecting device 100 within the wireless feeding mat 90 has the exciting function and the Q-value measuring function of the exciting side according to the first embodiment, for example. The foreign matter detecting device 100 is designed separately from the system of the main body of the wireless feeding mat 90.

In addition, the portable apparatus 110 has a metal detecting circuit 120 including a detecting coil separately from a resonant circuit including a power receiving coil 21.

Figure 10:
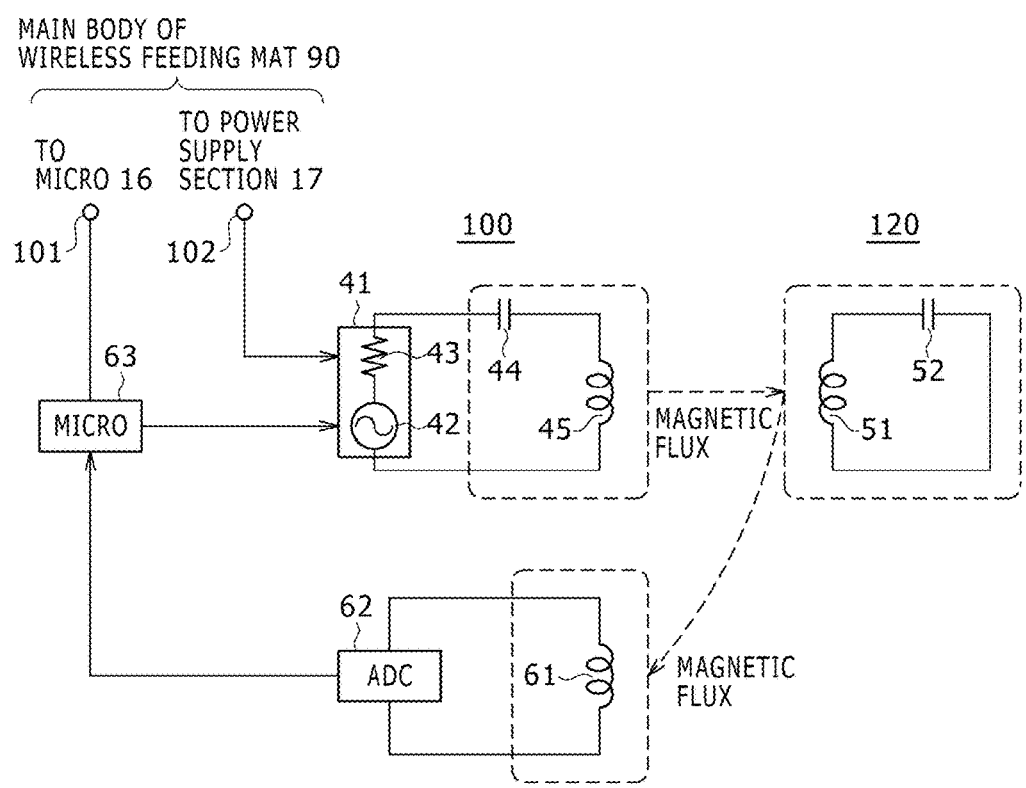
FIG. 10 is a schematic circuit diagram showing an example of configuration of a detecting system (a foreign matter detecting device and a detecting circuit) incorporated in the noncontact power transmission system (the wireless feeding mat and the portable apparatus) of FIG. 9.

FIG. 10 is a block diagram showing an example of configuration of the foreign matter detecting device and the metal detecting circuit in the fourth embodiment of the present disclosure.

The foreign matter detecting device 100 in the present embodiment includes an exciting section including an exciting coil 45 and a Q-value measuring section including a detecting coil 51.

The exciting section includes a signal source 41 including a signal generator 42 for generating an alternating-current signal and a resistance element 43, a capacitor 44, and an exciting coil 45. The foreign matter detecting device 100 does not perform feeding, and thus has a low-power circuit configuration as compared with a transmitting section including a power transmitting coil 15.

The Q-value measuring section includes a reading coil 61 for detecting a magnetic flux generated by the detecting coil 51 according to a magnetic field received by the detecting coil 51 from the exciting coil 45, an ADC 62, and a micro 63.

Terminals 101 and 102 are connected to the main body of the wireless feeding mat 90. The signal source 41, the micro 63, the ADC 62, and the like are connected to the power supply section 17 of the main body of the wireless feeding mat 90 via the terminal 102, and are supplied with power.

The metal detecting circuit 120 of the portable apparatus 110 is formed by the closed circuit of the detecting coil 51 as an example. The metal detecting circuit 120 does not need power. Thus, the metal detecting circuit 120 can be reduced in thickness, formed into the shape of a sheet, and stuck to the back surface of the casing of the portable apparatus 110, for example. Of course, the metal detecting circuit 120 may be disposed within the portable apparatus 110.

In the detecting system composed of the foreign matter detecting device 100 and the metal detecting circuit 120, a voltage generated in the reading coil 61 according to changes in the magnetic flux from the detecting coil 51 of the portable apparatus 110 is input to the ADC 62 to be converted from an analog to a digital signal.

Then, the voltage signal converted into the digital signal is input to the micro 63 for controlling the whole of the foreign matter detecting device 100. The micro 63 is connected to a micro 16 of the main body of the wireless feeding mat 90 via the terminal 101. The micro 16 controls the whole of the wireless feeding mat 90 in cooperation with the micro 63. For example, when the micro 63 determines as a result of the measurement of the Q-value that there is a metallic foreign matter, the micro 63 transmits the result of the determination to the micro 16. The micro 16 then performs control to stop the power transmission of the wireless feeding mat 90, for example.

According to the fourth embodiment, the foreign matter detecting device has an exciting function and a Q-value measuring function, and is designed separately from the system of the main body of the wireless feeding mat 90. Thereby, the foreign matter detecting device can be retro-fitted, or the whole of the foreign matter detecting device can be replaced, for example. In addition, the foreign matter detecting device may be formed into the shape of a sheet as with the metal detecting circuit, and stuck to an arbitrary position of the main body of the wireless feeding mat.

In addition, the foreign matter detecting device may be configured to have only the Q-value measuring function, the exciting function being realized by using the power transmitting section including a resonant circuit including the power transmitting coil 15 and a signal source 11.

Besides, the present embodiment of course provides actions and effects similar to those of the first and second embodiments.

6. Others

In the foregoing first to fourth embodiments, the resonant circuit on the exciting side (power transmitting device) is desirably disconnected after excitation (after the generation of a burst wave). This can prevent a phenomenon in which the resonant circuit on the exciting side and the resonant circuit on the power receiving side (power receiving device) interact with each other and affect the observed waveform. Therefore, the disturbance of the waveform observed through the detecting coil is reduced, the measurement of the Q-value is facilitated, and the accuracy of the Q-value is improved. As a conceivable realizing method, a switch such as a transistor, a MOSFET, or the like is connected to the resonant circuit, and the switch is switched under control of the micro to disconnect the capacitor. For example, in the case of the circuits shown in FIG. 2 and FIG. 4, a switch is connected in series with the capacitor, and the switch is turned off to disconnect the capacitor from the circuit after excitation.

In addition, a burst wave is cited as an example of an electromagnetic wave generated by the signal generator in the first to fourth embodiments. However, the Q-value may be measured using a single pulse wave (solitary wave).

In addition, the analog voltage signal obtained in the reading coil is input to the analog-to-digital converter in the first to fourth embodiments. However, the present disclosure is not limited to this example. At a time of detection of the Q-value (at a time of amplitude measurement), the voltage signal may be input to the analog-to-digital converter after an envelope detection is performed in advance.

In addition, the envelope may be detected by signal processing (software), or may be detected by using hardware.

In the foregoing second to fourth embodiments of the present disclosure, the detecting device is applied to a noncontact power transmission system of an electromagnetic resonance type. However, the detecting device can be applied also to a noncontact power transmission system of an electromagnetic induction type to detect a metallic foreign matter with high accuracy.

Incidentally, the present disclosure can also adopt the following constitutions.

(1) A detecting device including:
a reading coil configured to read a magnetic flux generated by a detecting coil for detecting a magnetic field of an electromagnetic wave output from an exciting coil according to the magnetic field; and
a Q-value measuring section configured to measure a Q-value of the detecting coil on a basis of a temporal transition of oscillation of a voltage obtained in the reading coil according to the magnetic flux generated by the detecting coil.

(2) The detecting device according to the above (1),
wherein the Q-value measuring section measures the Q-value of the detecting coil on a basis of a voltage value at a first time of the voltage obtained in the reading coil and a voltage value at a second time of the voltage obtained in the reading coil after passage of a predetermined time from the first time.

(3) The detecting device according to the above (2),
wherein letting f be a frequency of the electromagnetic wave, letting $V_1$ be the voltage value at the first time ($t_1$), and letting $V_2$ be the voltage value at the second time ($t_2$), the Q-value is obtained by a following equation:

$$Q=\pi f(t_2-t_1)/\ln(V_1/V_2)$$

(4) The detecting device according to any one of the above (1) to (3), further including
a determining section configured to determine a state of electromagnetic coupling between the exciting coil and the detecting coil by comparing the Q-value measured by the Q-value measuring section with a reference value set in advance.

(5) The detecting device according to the above (4),
wherein the state of electromagnetic coupling between the exciting coil and the detecting coil, the state being determined by the determining section, is presence or absence of a circuit including a conductor or an arbitrary coil between the two coils.

(6) The detecting device according to any one of the above (1) to (5), further including
the exciting coil.

(7) The detecting device according to any one of the above (1) to (6), further including:
one coil serving both as the exciting coil and as the reading coil; and
a switching section configured to switch between a mode of using the coil as the exciting coil and a mode of using the coil as the reading coil,
wherein when the electromagnetic wave is output from the coil, the coil is used as the exciting coil by switching the switching section, and
when the magnetic flux generated by the detecting coil is read on a noncontact basis, the coil is used as the reading coil by switching the switching section.

(8) The detecting device according to any one of the above (1) to (7),
wherein the reading coil detects the magnetic flux generated by a resonant circuit including the detecting coil resonating with the magnetic field of the electromagnetic wave output from a resonant circuit including the exciting coil according to the resonance.

(9) A detecting system including:
a detecting coil configured to detect a magnetic field of an electromagnetic wave output from an exciting coil;
a reading coil configured to read a magnetic flux generated by the detecting coil according to the magnetic field; and
a Q-value measuring section configured to measure a Q-value of the detecting coil on a basis of a temporal transition of oscillation of a voltage obtained in the reading coil according to the magnetic flux generated by the detecting coil.

(10) The detecting system according to the above (9), further including
the exciting coil.

(11) The detecting system according to any one of the above (9) or (10), further including:
one coil serving both as the exciting coil and as the reading coil; and
a switching section configured to switch between a mode of using the coil as the exciting coil and a mode of using the coil as the reading coil;
wherein when the electromagnetic wave is output from the coil, the coil is used as the exciting coil by switching the switching section, and
when the magnetic flux generated by the detecting coil is read on a noncontact basis, the coil is used as the reading coil by switching the switching section.

(12) A power transmitting device including:
a power transmitting coil configured to output a power transmission signal used for noncontact power transmission to an outside by radio;
a power transmitting section configured to supply the power transmission signal to the power transmitting coil;
a reading coil configured to read a magnetic flux generated by a detecting coil for detecting a magnetic field of an electromagnetic wave output from the power transmitting coil according to the magnetic field; and
a Q-value measuring section configured to measure a Q-value of the detecting coil on a basis of a temporal transition of oscillation of a voltage obtained in the reading coil according to the magnetic flux generated by the detecting coil.

(13) The power transmitting device according to the above (12), further including
an exciting coil,
wherein the detecting coil detects the magnetic field of the electromagnetic wave output from the exciting coil.

(14) The power transmitting device according to the above (12) or (13),
wherein one coil serves as the power transmitting coil and the exciting coil, or as the exciting coil and the reading coil, or as the power transmitting coil, the exciting coil, and the reading coil.

(15) A noncontact power transmission system including:
a power transmitting device; and
a power receiving device configured to receive power transmitted from the power transmitting device by radio,
the power transmitting device including
a power transmitting coil configured to output a power transmission signal used for noncontact power transmission to an outside by radio,
a power transmitting section configured to supply the power transmission signal to the power transmitting coil,
a reading coil configured to read a magnetic flux generated by a detecting coil for detecting a magnetic field of an electromagnetic wave output from the power transmitting coil according to the magnetic field; and a Q-value measuring section configured to measure a Q-value of the detecting coil on a basis of a temporal transition of oscillation of a voltage obtained in the reading coil according to the magnetic flux generated by the detecting coil, and the power receiving device including a power receiving coil used to receive the power transmission signal output from the power transmitting device, and the detecting coil configured to receive the magnetic field of the electromagnetic wave output from the power transmitting device, and generate the magnetic flux according to the magnetic field.

(16) The noncontact power transmission system according to the above (15), further including an exciting coil, wherein the detecting coil detects the magnetic field of the electromagnetic wave output from the exciting coil.

(17) The noncontact power transmission system according to the above (15) or (16), wherein in the power transmitting device, one coil serves as the power transmitting coil and the exciting coil, or as the exciting coil and the reading coil, or as the power transmitting coil, the exciting coil, and the reading coil, and in the power receiving device, one coil serves as the power receiving coil and the detecting coil.

(18) A detecting method including:

outputting an electromagnetic wave from an exciting coil;

reading a magnetic flux generated by a detecting coil for detecting a magnetic field of the electromagnetic wave output from the exciting coil according to the magnetic field by a reading coil; and measuring a Q-value of the detecting coil on a basis of a temporal transition of oscillation of a voltage obtained in the reading coil according to the magnetic flux generated by the detecting coil by a Q-value measuring section.

Incidentally, the series of processes in each of the foregoing embodiments can be carried out by hardware, and can also be carried out by software. When the series of processes is to be carried out by software, the series of processes can be carried out by a computer where a program constituting the software is incorporated in dedicated hardware or a computer on which programs for performing various functions are installed. For example, it suffices to install the program constituting the desired software onto a general-purpose computer or the like, and execute the program.

In addition, a recording medium on which the program code of the software for implementing the functions of the foregoing embodiments is recorded may be supplied to a system or a device. In addition, it is needless to say that the functions are implemented when a computer (or a control device such as a CPU or the like) of the system or the device reads and executes the program code stored on the recording medium.

Usable as the recording medium for supplying the program code in this case are for example a flexible disk, a hard disk, an optical disk, a magneto-optical disk, a CD-ROM, a CD-R, a magnetic tape, a nonvolatile memory card, and a ROM.

Further, the functions of the foregoing embodiments are implemented by executing the program code read by the computer. In addition, on the basis of instructions of the program code, an OS or the like operating on the computer performs a part or the whole of actual processing. The present disclosure also includes cases where the functions of the foregoing embodiments are implemented by the processing.

In addition, processing steps describing time-series processes in the present specification not only include processes performed in time series in the described order but also include processes not necessarily performed in time series but performed in parallel or individually (for example parallel processing or processing based on an object).

The present disclosure is not limited to the foregoing embodiments, but various other examples of modification and application can of course be adopted without departing from the spirit described in claims.

That is, the examples of the foregoing embodiments are suitable concrete examples of the present disclosure, and thus various technically desirable limitations are added. However, the technical scope of the present disclosure is not limited to these forms unless there is a description specifically limiting the present disclosure in each description. For example, materials used and amounts of the materials used, process times, process order, numerical conditions of respective parameters, and the like cited in the above descriptions are mere suitable examples, and sizes, shapes, and arrangement relations in the respective diagrams used for description are also schematic.

The present technology contains subject matter related to that disclosed in Japanese Priority Patent Application JP 2011-283929 filed in the Japan Patent Office on Dec. 26, 2011, the entire content of which is hereby incorporated by reference.

What is claimed is:

1. A detecting device, comprising:
a reading coil configured to read a magnetic flux, generated by a detecting coil, to detect a magnetic field of an electromagnetic wave output from an exciting coil;
a Q-value measuring section configured to measure a Q-value of the detecting coil based on a frequency of the electromagnetic wave and a temporal transition of oscillation of a voltage obtained in the reading coil,
wherein the voltage is obtained based on the magnetic flux generated by the detecting coil,
wherein the Q-value is obtained by a following equation:

$$Q=\pi f(t_2-t_1)/\ln(V_1/V_2), \text{ and}$$

wherein f is a frequency of the electromagnetic wave, $V_1$ is a first voltage value obtained in the reading coil at a first time ($t_1$), and $V_2$ is a second voltage value obtained in the reading coil at a second time ($t_2$);
a determining section configured to:
determine a presence of a circuit between the exciting coil and the detecting coil based on comparison between the Q-value and a reference value,
wherein the circuit includes one of a conductor or an arbitrary coil; and
determine a state of electromagnetic coupling between the exciting coil and the detecting coil based on the presence of the circuit; and
a control section configured to control, based on the determined state of electromagnetic coupling between the exciting coil and the detecting coil, a power supply to the exciting coil to minimize eddy currents between the exciting coil and the detecting coil, wherein the eddy currents are generated based on the presence of the circuit between the exciting coil and the detecting coil.

2. The detecting device according to claim 1,
wherein the second voltage value is obtained in the reading coil after passage of a threshold time from the first time.

3. The detecting device according to claim 1, wherein the state of electromagnetic coupling between the exciting coil and the detecting coil indicates a lack of the circuit between the exciting coil and the detecting coil.

4. The detecting device according to claim 1, further comprising the exciting coil.

5. The detecting device according to claim 1, further comprising:
one coil that serves both as the exciting coil and as the reading coil; and
a switching section configured to switch between a first mode in which the one coil is used as the exciting coil and a second mode in which the one coil is used as the reading coil,
wherein, based on the electromagnetic wave that is output from the one coil, the one coil is used as the exciting coil by the switch of the switching section to the first mode, and
wherein, based on a wireless detection of the magnetic flux generated by the detecting coil, the one coil is used as the reading coil by the switch of the switching section to the second mode.

6. The detecting device according to claim 1,
wherein the reading coil is further configured to detect the magnetic flux generated by a first resonant circuit including the detecting coil,
wherein the magnetic flux generated by the first resonant circuit resonates with the magnetic field of the electromagnetic wave output from a second resonant circuit including the exciting coil, and
wherein the magnetic flux generated by the first resonant circuit is detected based on the resonance.

7. The detecting device according to claim 1, whether the control section is further configured to stop, based on the determined state of electromagnetic coupling between the exciting coil and the detecting coil, the power supply to the exciting coil.

8. The detecting device according to claim 1,
wherein the reference value is the Q-value of the detecting coil at each frequency, and
wherein the reference value is set in a state of a lack of the circuit including one of the conductor or the arbitrary coil between the detecting coil and the exciting coil.

9. The detecting device according to claim 1,
wherein a coupling coefficient between the detecting coil and the reading coil is 0.1.

10. The detecting device according to claim 1,
wherein a coupling coefficient between the exciting coil and the detecting coil is 0.1.

11. A detecting system, comprising:
a detecting coil configured to detect a magnetic field of an electromagnetic wave output from an exciting coil;
a reading coil configured to read a magnetic flux generated by the detecting coil based on the magnetic field;
a Q-value measuring section configured to measure a Q-value of the detecting coil based on a frequency of the electromagnetic wave and a temporal transition of oscillation of a voltage obtained in the reading coil,
wherein the voltage is obtained based on the magnetic flux generated by the detecting coil,
wherein the Q-value is obtained by a following equation:

$Q = \pi f(t_2 - t_1)/\ln(V_1/V_2)$, and wherein f is a frequency of the electromagnetic wave, $V_1$ is a first voltage value obtained in the reading coil at a first time ($t_1$), and $V_2$ is a second voltage value obtained in the reading coil at a second time ($t_2$);
a determining section configured to:
determine a presence of a circuit between the exciting coil and the detecting coil based on a comparison between the Q-value and a reference value, wherein the circuit includes one of a conductor or an arbitrary coil; and
determine a state of electromagnetic coupling between the exciting coil and the detecting coil based on the presence of the circuit; and
a control section configured to control, based on the determined state of electromagnetic coupling between the exciting coil and the detecting coil, a power supply to the exciting coil to minimize eddy currents between the exciting coil and the detecting coil, wherein the eddy currents are generated based on the presence of the circuit between the exciting coil and the detecting coil.

12. The detecting system according to claim 11, further comprising the exciting coil.

13. The detecting system according to claim 11, further comprising:
one coil that serves both as the exciting coil and as the reading coil; and
a switching section configured to switch between a first mode in which the one coil is used as the exciting coil and a second mode in which the one coil is used as the reading coil,
wherein, based on the electromagnetic wave that is output from the coil, the one coil is used as the exciting coil by the switch of the switching section to the first mode, and
wherein, based on a wireless detection of the magnetic flux generated by the detecting coil, the one coil is used as the reading coil by the switch of the switching section to the second mode.

14. A detecting method, comprising:
outputting an electromagnetic wave from an exciting coil;
detecting a magnetic field of the electromagnetic wave output from the exciting coil;
reading a magnetic flux based on the magnetic field,
wherein the magnetic flux is generated by a detecting coil;
measuring a Q-value of the detecting coil based on a frequency of the electromagnetic wave and a temporal transition of oscillation of a voltage obtained in a reading coil,
wherein the voltage is obtained based on the magnetic flux generated by the detecting coil by a Q-value measuring section,
wherein the Q-value is obtained by a following equation:

$Q = \pi f(t_2 - t_1)/\ln(V_1/V_2)$, and wherein f is a frequency of the electromagnetic wave, $V_1$ is a first voltage value obtained in the reading coil at a first time ($t_1$), and $V_2$ is a second voltage value obtained in the reading coil at a second time ($t_2$);
determining a presence of a circuit between the exciting coil and the detecting coil based on a comparison between the Q-value and a reference value,
wherein the circuit includes one of a conductor or an arbitrary coil;

determining a state of electromagnetic coupling between the exciting coil and the detecting coil based on the presence of the circuit; and controlling, based on the determined state of electromagnetic coupling between the exciting coil and the detecting coil, a power supply to the exciting coil to minimize eddy currents between the exciting coil and the detecting coil, wherein the eddy currents are generated based on the presence of the circuit between the exciting coil and the detecting coil.

* * * * *